(12) United States Patent
Nagayama et al.

(10) Patent No.: US 8,545,672 B2
(45) Date of Patent: Oct. 1, 2013

(54) PLASMA PROCESSING APPARATUS

(75) Inventors: Nobuyuki Nagayama, Miyagi (JP); Eiichiro Kikuchi, Miyagi (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/290,440

(22) Filed: Nov. 7, 2011

(65) Prior Publication Data

US 2012/0111500 A1    May 10, 2012

Related U.S. Application Data

(60) Provisional application No. 61/417,359, filed on Nov. 26, 2010.

(30) Foreign Application Priority Data

Nov. 9, 2010  (JP) .................................. 2010-250461

(51) Int. Cl.
*H01L 21/306* (2006.01)
*H01L 21/683* (2006.01)
*C23C 16/00* (2006.01)

(52) U.S. Cl.
USPC .................. 156/345.47; 118/723 E; 156/915; 361/234

(58) Field of Classification Search
USPC ............... 361/234; 156/915, 345.51, 345.47; 118/728, 723 E
See application file for complete search history.

(56) References Cited

U.S. PATENT DOCUMENTS

| 6,475,336 | B1 * | 11/2002 | Hubacek .................. 156/345.51 |
| 6,733,624 | B2 * | 5/2004 | Koshiishi et al. ................. 438/6 |
| 7,102,872 | B2 * | 9/2006 | Cho et al. ....................... 361/234 |
| 2004/0261946 | A1 * | 12/2004 | Endoh et al. ............. 156/345.15 |
| 2005/0120960 | A1 * | 6/2005 | Chen ............................. 118/728 |
| 2005/0272227 | A1 * | 12/2005 | Moriya et al. ................ 438/474 |
| 2007/0283891 | A1 * | 12/2007 | Okayama ...................... 118/728 |
| 2008/0236749 | A1 * | 10/2008 | Koshimizu et al. ....... 156/345.33 |
| 2009/0242134 | A1 * | 10/2009 | Iwata ........................ 156/345.48 |
| 2012/0160808 | A1 * | 6/2012 | Kikuchi et al. ................. 216/67 |

FOREIGN PATENT DOCUMENTS

| JP | 10-303288 | 11/1998 |
| JP | 2004-235623 | 8/2004 |
| JP | 2005064460 A | * 3/2005 |
| JP | 2005286027 A | * 10/2005 |
| KR | 2006079335 A | * 7/2006 |

\* cited by examiner

*Primary Examiner* — Sylvia R MacArthur
*Assistant Examiner* — Anna Crowell
(74) *Attorney, Agent, or Firm* — Cantor Colburn LLP

(57) ABSTRACT

The plasma processing apparatus includes: a processing chamber an inside of which is airtightly closable; a process gas supplying mechanism which supplies a process gas into the processing chamber; an exhaust mechanism which evacuates the inside of the processing chamber; a plasma generating mechanism which generates plasma from the process gas; a holding stage which is provided in the processing chamber and configured such that a substrate to be processed and a focus ring provided to surround the substrate to be processed are held on a same plane; a temperature control mechanism which adjusts a temperature of the holding stage; and an electrostatic chuck which is provided on a top surface of the holding stage and comprises an adsorbing electrode extending to a portion under the focus ring.

4 Claims, 7 Drawing Sheets

PLASMA PROCESSING APPARATUS

CROSS-REFERENCE TO RELATED PATENT APPLICATIONS

This application claims the benefit of Japanese Patent Application No. 2010-250461, filed on Nov. 9, 2010, in the Japan Patent Office, and U.S. Patent Application No. 61/417359, filed on Nov. 26, 2010, in the United States Patent and Trademark Office, the disclosure of which are incorporated herein in their entireties by reference.

BACKGROUND OF THE INVENTION

1. Field of the Invention

The present invention relates to a plasma processing apparatus.

2. Description of the Related Art

A plasma processing apparatus for processing a substrate, such as a semiconductor wafer or a glass substrate for a liquid crystal display device, by using plasma, for example, a plasma etching apparatus or a plasma chemical vapor deposition (CVD) apparatus, has been used to manufacture a semiconductor device or the like.

In the plasma processing apparatus, a holding stage on which a substrate is held is provided in a processing chamber and an electrostatic chuck for adsorbing the substrate is provided in the holding stage. The plasma processing apparatus including the electrostatic chuck provided in the holding stage is configured such that, in order to protect the electrostatic chuck from plasma, a holding surface of the holding stage has a convex shape and a size of the holding surface having the convex shape is slightly less than a size of the substrate, so as for an adsorbing surface of the electrostatic chuck provided on the holding surface not to be exposed to the plasma.

Also, in a plasma processing apparatus including a focus ring provided around a substrate such as a semiconductor wafer, an electrostatic chuck for adsorbing the focus ring is provided in addition to an electrostatic chuck for adsorbing the semiconductor wafer, and the focus ring is adsorbed to a holding stage, to control a temperature of the focus ring by using a temperature control medium circulating in the holding stage (as disclosed in, for example, Patent Document 1).

Also, in a plasma processing apparatus for processing a semiconductor wafer having a diameter of, for example, 300 mm, a diameter of a holding surface of a holding stage having a convex shape (a diameter of an adsorbing surface of an electrostatic chuck) ranges from, for example, about 296 to 298 mm, and the entire adsorbing surface of the electrostatic chuck is covered by the semiconductor wafer, so as for the adsorbing surface of the electrostatic chuck not to be exposed to plasma during processing. Also, in this case, a diameter of an electrode for the electrostatic chuck buried in the adsorbing surface of the electrostatic chuck is even less than a diameter of the adsorbing surface.

Also, a plasma processing apparatus is configured such that a focus ring having a thin plate shape is held on the same plane as a semiconductor wafer, and thus an impedance of the focus ring gets closer to an impedance of the semiconductor wafer (as disclosed in, for example, Patent Document 2).

As described above, in a conventional plasma processing apparatus, diameters of a holding surface of a holding stage on which a substrate is held and an adsorbing surface of an electrostatic chuck provided on the holding surface are less than a diameter of a semiconductor wafer to be subjected to plasma processing, so as for the adsorbing surface of the electrostatic chuck not to be exposed to plasma.

However, in the plasma processing apparatus configured as described above, since a peripheral portion of a semiconductor wafer is not adsorbed to an electrostatic chuck, a temperature of the peripheral portion of the semiconductor wafer may be higher than that of other portions. Accordingly, due to a temperature difference between a central portion and the peripheral portion of the semiconductor wafer, a plasma processing state may vary between the central portion and the peripheral portion of the semiconductor wafer. For example, when a hole is formed in a to-be-etched film formed on the semiconductor wafer by using plasma etching, generation of the hole may vary between the central portion and the peripheral portion of the semiconductor wafer, or a selectivity of the to-be-etched film with respect to a photoresist may vary between the central portion and the peripheral portion of the semiconductor wafer. Accordingly, in-plane uniformity of plasma processing is reduced. Also, the aforesaid technology of Patent Document 2 pays attention to impedance, and does not consider temperature.

[Patent Document 1] Japanese Laid-Open Patent Publication No. hei 10-303288

[Patent Document 2] Japanese Laid-Open Patent Publication No. 2004-235623

SUMMARY OF THE INVENTION

To solve the above and/or other problems, according to the present invention, there is provided a plasma processing apparatus which may improve in-plane uniformity of plasma processing by keeping a temperature of a peripheral portion of a substrate to be processed from increasing, thereby making it possible to perform uniform plasma processing.

According to an aspect of the present invention, there is provided a plasma processing apparatus including: a processing chamber an inside of which is airtightly closable; a process gas supplying mechanism which supplies a process gas into the processing chamber; an exhaust mechanism which evacuates the inside of the processing chamber; a plasma generating mechanism which generates plasma from the process gas; a holding stage which is provided in the processing chamber and is configured such that a substrate to be processed and a focus ring provided to surround the substrate to be processed are held on a same plane; a temperature control mechanism which adjusts a temperature of the holding stage; and an electrostatic chuck which is provided on a top surface of the holding stage and includes an adsorbing electrode extending to a portion under the focus ring.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
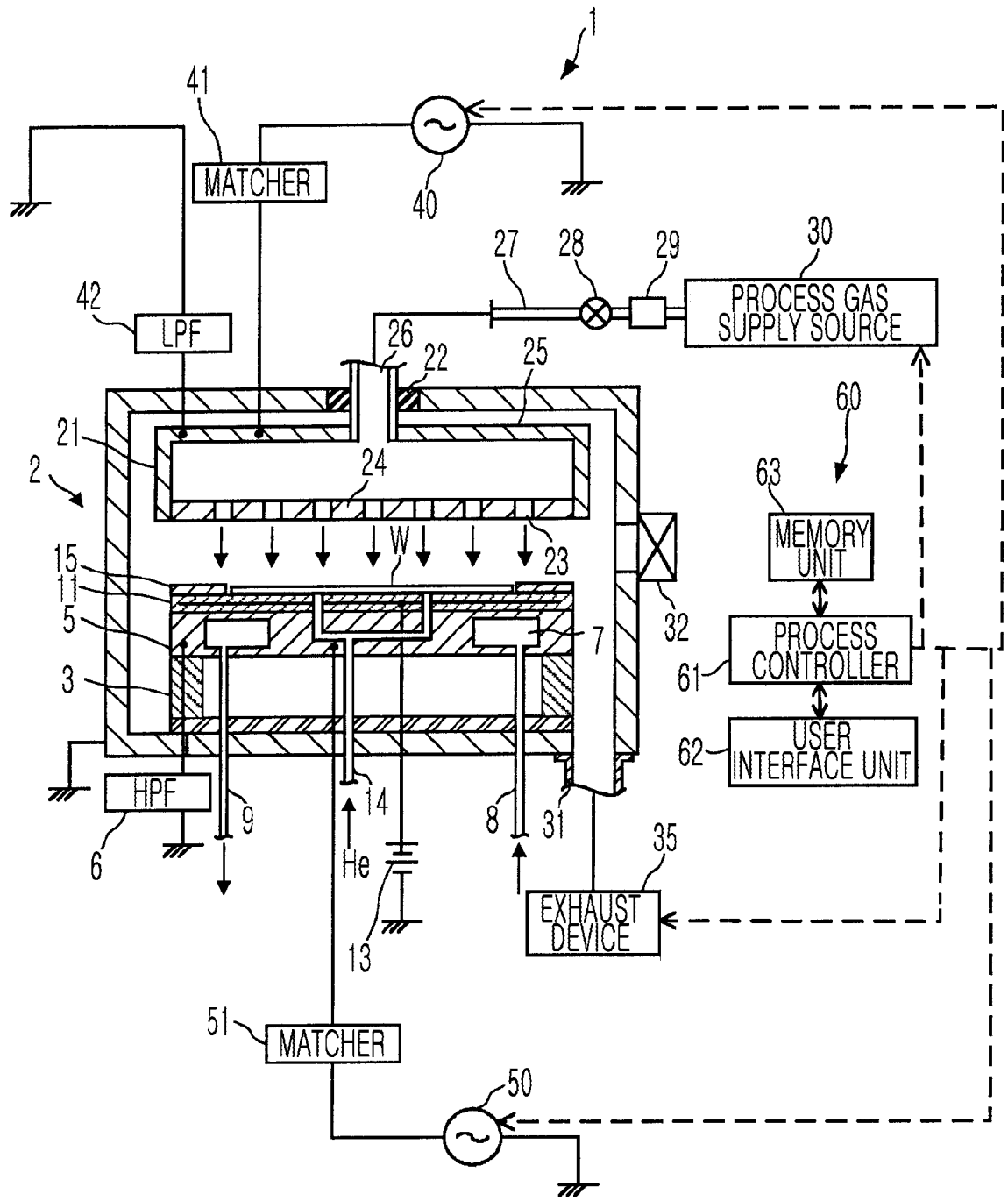
FIG. 1 is a view schematically showing a configuration of a plasma etching apparatus according to an embodiment of the present invention.

FIG. 1 is a view schematically showing main parts of a plasma etching apparatus 1 according to an embodiment of the present invention. The plasma etching apparatus 1 is a capacitively coupled parallel plate-type etching apparatus in which electrode plates face each other to be parallel to each other and a power supply for forming plasma is connected to the electrode plates.

The plasma etching apparatus 1 includes a processing chamber 2 which has a cylindrical shape and is formed of, for example, aluminium of which a surface is anodized, and the processing chamber 2 is grounded. A susceptor (a holding stage) 5 having a substantially cylindrical shape is provided at a bottom of the processing chamber 2 with a support member 3 having a cylindrical container shape and formed of an insulating material such as ceramic therebetween.

A semiconductor wafer W which is a substrate to be processed and a focus ring 15 which has an annular shape and surrounds the semiconductor wafer W are held on the susceptor 5. The focus ring 15 is formed of, for example, silicon, and is used to improve in-plane uniformity of etching. Also, the susceptor 5 serves as a lower electrode, and a high-pass filter (HPF) 6 is connected to the susceptor 5.

A coolant chamber 7 is provided in the susceptor 5, and a coolant is introduced through a coolant introduction pipe 8 into the coolant chamber 7, circulates in the coolant chamber 7, and is discharged from a coolant discharge pipe 9. The coolant circulating in the coolant chamber 7 cools the semiconductor wafer W through the susceptor 5, and thus a temperature of the semiconductor wafer W is controlled to a desired temperature.

Figure 2:
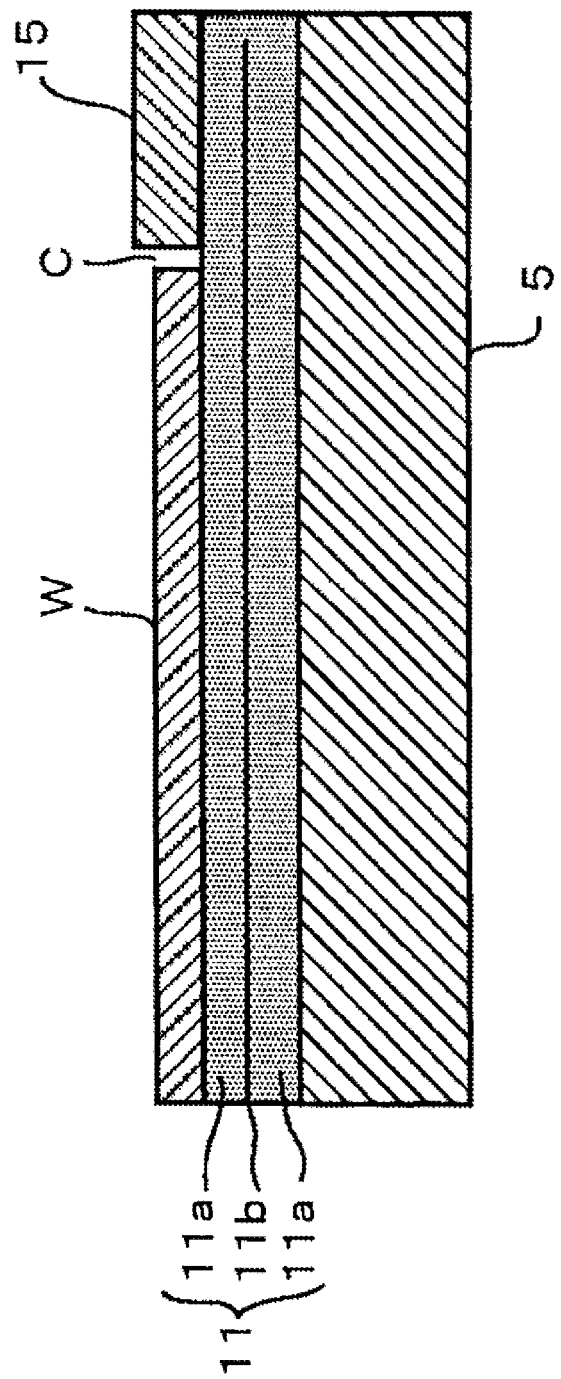
FIG. 2 is a view showing main parts of the plasma etching apparatus of FIG. 1.

The susceptor 5 is formed such that a top surface of the susceptor 5 has a planar shape, and an electrostatic chuck 11 is provided on the top surface having the planar shape. As shown in FIG. 2, the electrostatic chuck 11 includes insulating layers 11a and an adsorbing electrode 11b which is a conductive layer and is disposed between the insulating layers 11a. The electrostatic chuck 11 is provided to cover the entire top surface of the susceptor 5, and the adsorbing electrode 11b extends outward beyond a peripheral portion of the semiconductor wafer W to reach under the focus ring 15. A direct current voltage of, for example, 1.5 kV, is applied from a direct current power supply 13 shown in FIG. 1 to the adsorbing electrode 11b of the electrostatic chuck 11. Accordingly, the semiconductor wafer W and the focus ring 15 are electrostatically adsorbed due to, for example, a Coulomb force.

A gas passage 14 through which a heat transfer medium (for example, a helium (He) gas or the like) is supplied to a rear surface of the semiconductor wafer W is formed in the susceptor 5 and the electrostatic chuck 11, and the susceptor 5 cools the semiconductor wafer W through the electrostatic chuck 11 by means of the heat transfer medium, thereby maintaining the semiconductor wafer W at a predetermined temperature.

As described above, in the plasma etching apparatus 1 of the present embodiment, the top surface of the susceptor 5 has the planar shape, instead of a convex shape, and the adsorbing electrode 11b of the electrostatic chuck 11 extends outward beyond the peripheral portion of the semiconductor wafer W to reach under the focus ring 15. Accordingly, the entire semiconductor wafer W including the peripheral portion is adsorbed to the electrostatic chuck 11. Accordingly, a temperature of the entire semiconductor wafer W is adjusted by the cooling of the susceptor 5, thereby keeping a temperature of the peripheral portion of the semiconductor wafer W from increasing.

Also, in the present embodiment, since the adsorbing electrode 11b extends under the focus ring 15, the semiconductor wafer W and the focus ring 15 formed of a silicon material may be electrostatically adsorbed by using one adsorbing electrode 11b. As such, since the top surface of the susceptor 5 including a holding portion of the focus ring 15 has the planar shape and the semiconductor wafer W and the focus ring 15 are adsorbed by using one adsorbing electrode 11b, an adsorbing structure of the focus ring 15 may be easily realized without performing a process of forming an additional adsorbing electrode for adsorbing the focus ring 15.

The insulating layers 11a and the adsorbing electrode 11b constituting the electrostatic chuck 11 may be formed by performing spraying on a base material of the susceptor 5 formed of aluminum or the like. If the insulating layers 11a are formed by spraying, when the insulating layers 11a are etched by plasma and thus thicknesses of the insulating layers 11a are reduced, the insulating layers 11a may be repaired by spraying. Also, since an adsorbing electrode for adsorbing the semiconductor wafer W and the focus ring 15 may be formed by performing spraying once, the adsorbing structure of the focus ring 15 may be realized at a low cost.

Ceramic such as $Al_2O_3$ or $Y_2O_3$ may be used as a material of the insulating layers 11a. $Y_2O_3$ has high resistance to plasma and is difficult to be etched by plasma. Also, when the same silicon as a material of a semiconductor wafer is used, the semiconductor wafer may be prevented from being contaminated with foreign substances. Also, silicon or silicon nitride may be used as a material of the focus ring 15.

As shown in FIG. 2, when the semiconductor wafer W is held on the electrostatic chuck 11, an interval C of, for example, about 0.5 to 2 mm, is formed between the peripheral portion of the semiconductor wafer W and an inner peripheral portion of the focus ring 15 in relation to a transfer precision of the semiconductor wafer W. Plasma enters into the interval C, and thus a portion of the insulating layers 11a of the electrostatic chuck 11 under the interval C is particularly etched by the plasma. When a thickness of the insulating layer 11a over the adsorbing electrode 11b is reduced and fails to obtain insulation resistance, the electrostatic chuck 11 may no longer be used.

Figure 3:
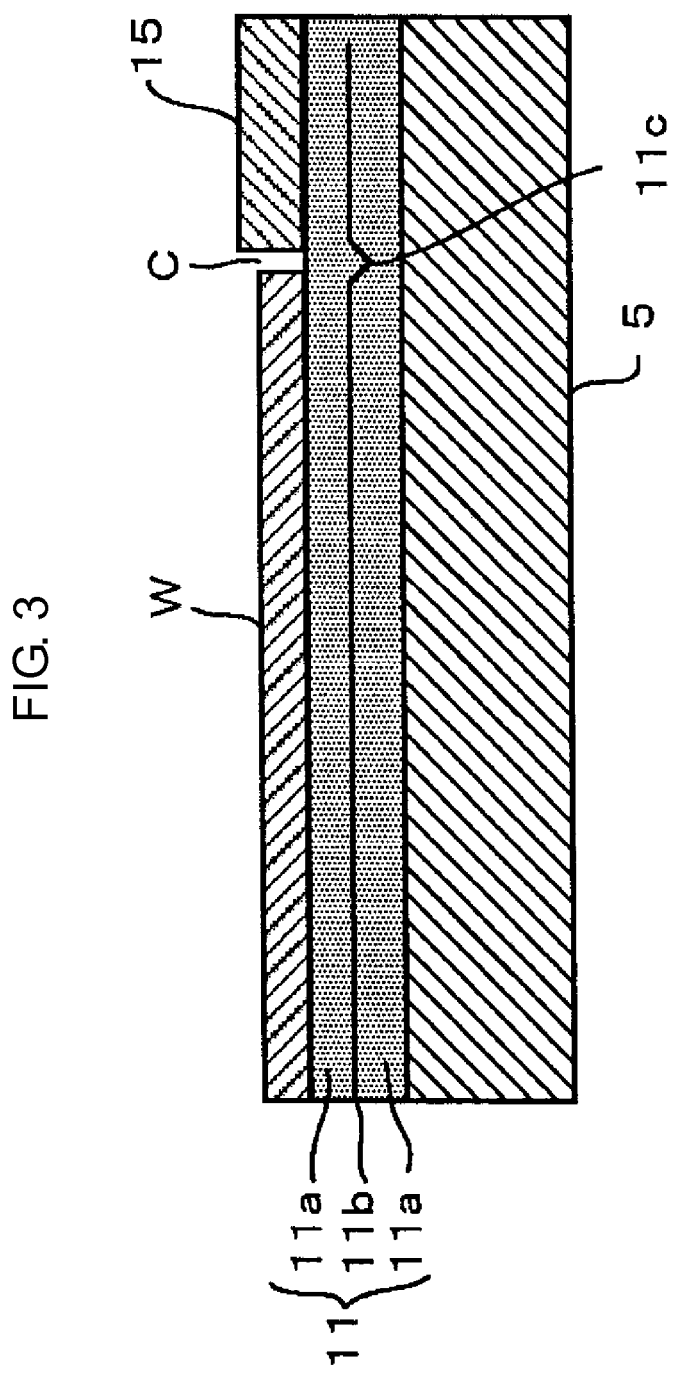
FIG. 3 is a view showing main parts of a modified example of the plasma etching apparatus of FIG. 1.

Accordingly, as shown in FIG. 3, a bent portion 11c which is bent downward may be formed at a portion of the adsorbing electrode 11b corresponding to a boundary between the semiconductor wafer W and the focus ring 15 (that is, a portion of the adsorbing electrode 11b disposed under the interval C). As such, since the bent portion 11c is formed in the adsorbing electrode 11b, a usage time until insulation resistance is not obtained may be increased, thereby extending a lifetime of the electrostatic chuck 11. Also, a thickness of the insulating layer 11a over the adsorbing electrode 11b is, for example, about several hundred microns, and in this case, the bent portion 11c may be formed by bending the adsorbing electrode 11b downward by about tens of microns to a hundred microns.

As shown in FIG. 1, an upper electrode 21 is provided above the susceptor 5 to face the susceptor 5 in parallel to the susceptor 5. The upper electrode 21 is supported by a top of the processing chamber 2 with an insulating material 22 therebetween. The upper electrode 21 includes an electrode plate 24, and an electrode support 25 which is formed of a conductive material and supports the electrode plate 24. The electrode plate 24 is formed of, for example, a conductor or a semiconductor, and has a plurality of ejection holes 23 formed therein. The electrode plate 24 faces the susceptor 5.

A gas introduction port 26 is provided at a center of the electrode support 25 of the upper electrode 21, and a gas supply pipe 27 is connected to the gas introduction port 26. Also, a process gas supply source 30 is connected to the gas supply pipe 27 with a valve 28 and a mass flow controller 29 therebetween. A process gas for performing plasma etching processing is supplied from the process gas supply source 30.

An exhaust pipe 31 is connected to the bottom of the processing chamber 2, and an exhaust device 35 is connected to the exhaust pipe 31. The exhaust device 35 includes a vacuum pump such as a turbo molecular pump, and is configured to reduce a pressure in the processing chamber 2 to a predetermined pressure of, for example, 1 Pa or less, through vacuum suction. Also, a gate valve 32 is provided at a side wall of the processing chamber 2, and the semiconductor wafer W is transferred from and into an adjacent load-lock chamber (not shown) when the gate valve 32 is opened.

A first high frequency power supply 40 is connected to the upper electrode 21, and a matching unit 41 is inserted into a power supply line of the first high frequency power supply 40. Also, a low-pass filter (LPF) 42 is connected to the upper electrode 21. The first high frequency power supply 40 is configured to output high frequency power having a frequency ranging from, for example, 50 to 150 MHz. High frequency power having such a frequency is applied to the upper electrode 21, and thus, desired dissociation may occur and high-density plasma may be formed in the processing chamber 2.

A second high frequency power supply 50 is connected to the susceptor 5, which serves as a lower electrode, and a matching unit 51 is inserted into a power supply line of the second high frequency power supply 50. The second high frequency power supply 50, which outputs high frequency power having a frequency lower than that of the first high frequency power supply 40, applies high frequency power having such a low frequency, and thus, ions may act properly without damaging the semiconductor wafer W, which is a substrate to be processed. About 20 MHz or less (13.56 MHz in the present embodiment) is used as a frequency of the second high frequency power supply 50.

An overall operation of the plasma etching apparatus 1 configured as described above is controlled by a control unit 60. The control unit 60 includes a process controller 61, which includes a central processing unit (CPU) and controls each portion of the plasma etching apparatus 1, a user interface unit 62, and a memory unit 63.

The user interface unit 62 includes a keyboard through which a command is input in order for a process manager to manage the plasma processing apparatus 1, or a display which visually displays an operating state of the plasma etching apparatus 1.

A recipe which is process condition data or a control program (software) for performing various processes by using the plasma etching apparatus 1 under the control of the process controller 61 is stored in the memory unit 63. If necessary, a desired process is performed in the plasma etching apparatus 1 under the control of the process controller 61 by reading an arbitrary recipe from the memory unit 63 and performing a process according to the arbitrary recipe under the control of the process controller 61 upon receiving an instruction from the user interface unit 62. Also, the recipe which is process condition data or a control program may be used in a state stored in a computer-readable storage medium (for example, a hard disc, a compact disc (CD), a flexible disc, or a semiconductor memory), or may be used by being transmitted at any time online from another device through, for example, a dedicated line.

When plasma etching is performed on the semiconductor wafer W by using the plasma etching apparatus 1 shown in FIG. 1, first, the gate valve 32 is opened, and then the semiconductor wafer W is transferred into the processing chamber 2 from the load-lock chamber (not shown) and is held on the electrostatic chuck 11. When a direct current is applied from the direct current source 13, the semiconductor wafer W is electrostatically adsorbed to the electrostatic chuck 11. Next, the gate valve 32 is closed, the processing chamber 2 is depressurized by the exhaust device 35 to a predetermined vacuum level through vacuum suction.

Next, the valve 28 is opened, a predetermined process gas is introduced from the process gas supply source 30, at a flow rate controlled by the mass flow controller 29, through the process gas supply pipe 27 and the gas introduction port 26 into a hollow portion of the upper electrode 21, passes through the ejection holes 23 of the electrode plate 24, and is uniformly ejected to the semiconductor wafer W as shown by arrows of FIG. 1.

The pressure in the processing chamber 2 is maintained at a predetermined pressure. Next, high frequency power having a predetermined frequency is applied to the upper electrode 21 from the first high frequency power supply 40. Accordingly, a high frequency electric field is generated between the upper electrode 21 and the susceptor 5, which is a lower electrode, thereby making the process gas dissociate and forming plasma.

Meanwhile, high frequency power having a frequency lower than that of the first high frequency power supply 40 is applied to the susceptor 5, which is a lower electrode, from the second high frequency power supply 50. Accordingly, ions in the plasma are dragged to the susceptor 5 and etching anisotropy is improved due to ion assistance.

During this plasma etching, in the plasma etching apparatus 1 of the present embodiment, since the entire semiconductor wafer W including the peripheral portion is adsorbed to the electrostatic chuck 11 to keep the temperature of the peripheral portion of the semiconductor wafer W from increasing, in-plane uniformity of plasma etching may be improved, as compared to a conventional apparatus, thereby making it possible to perform uniform plasma etching.

When the plasma etching ends, the high frequency power is no longer supplied and the process gas is no longer supplied, and the semiconductor wafer W is transferred from the processing chamber 2 in an order opposite to that described above.

Figure 4:
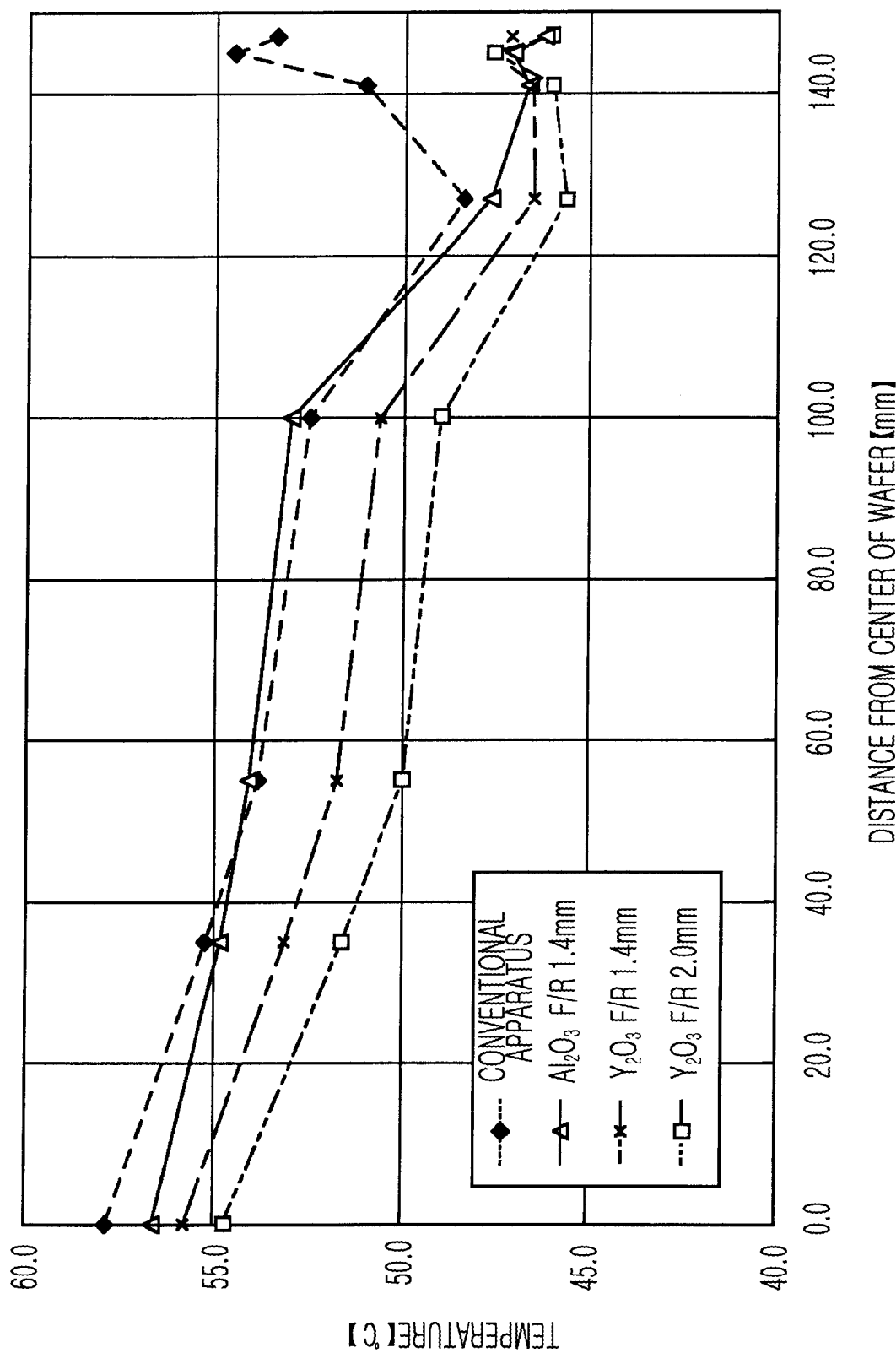
FIG. 4 is a graph showing a result obtained after measuring a temperature distribution of a semiconductor wafer.

A graph of FIG. 4 shows a result obtained after measuring a temperature of each of portions of a semiconductor wafer having a diameter of 300 mm (a radius of 150 mm) when etching is performed on the semiconductor wafer by using plasma for 60 seconds. A vertical axis of FIG. 4 represents a temperature and a horizontal axis of FIG. 4 represents a distance from a center of the wafer. A dotted line (marked by ♦) indicates a case of a conventional apparatus, and a solid line (marked by Δ), a one-dot-dashed line (marked by x), and a two-dot-dashed line (marked by ☐) indicate cases of the present embodiment. Also, the solid line (marked by Δ) indicates a case where Electro-Static Chuck (ESC) of a sprayed coating film formed of $Al_2O_3$ and a silicon focus ring having a thickness of 1.4 mm are used, the one-dot-dashed line (marked by x) indicates a case where ESC of a sprayed coating film formed of $Y_2O_3$ and a silicon focus ring having a thickness of 1.4 mm are used, and the two-dot-dashed line (marked by □) indicates a case where ESC of a sprayed coating film formed of $Y_2O_3$ and a silicon focus ring having a thickness of 2.0 mm are used.

Figure 6:
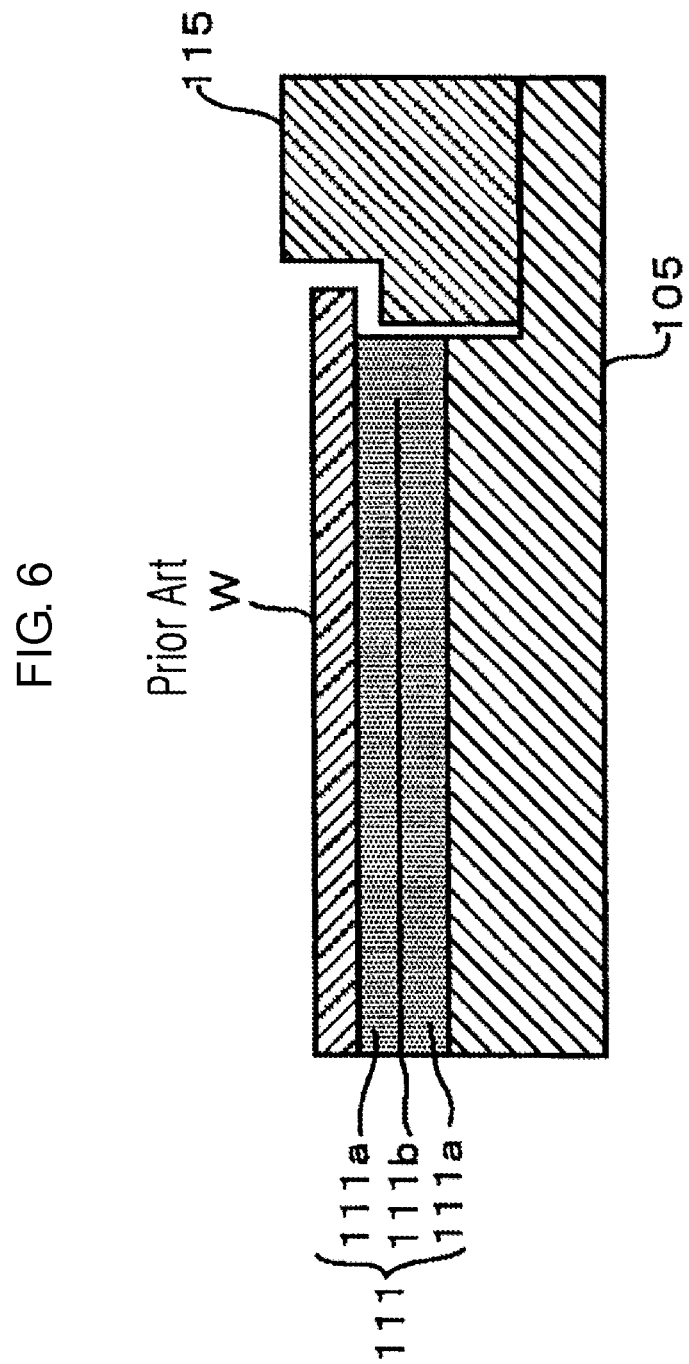
FIG. 6 is a view showing main parts of a conventional apparatus.

In the conventional apparatus indicated by the dotted line (marked by ♦), as shown in FIG. 6, a central portion of a holding stage (susceptor) 105 protrudes upward in a convex shape, and a diameter of an electrostatic chuck 111 including insulating layers 111a and an adsorbing electrode 111b which is a conductive layer is less than a diameter of a semiconductor wafer W, so that a focus ring 115 is provided on a stepped portion formed around the holding stage (susceptor) 105.

As shown in FIG. 4, a temperature of a peripheral portion of the semiconductor wafer W greatly increases in the conventional apparatus, whereas a temperature of a peripheral portion of a semiconductor wafer W is kept from increasing in the present embodiment.

Figure 5A:
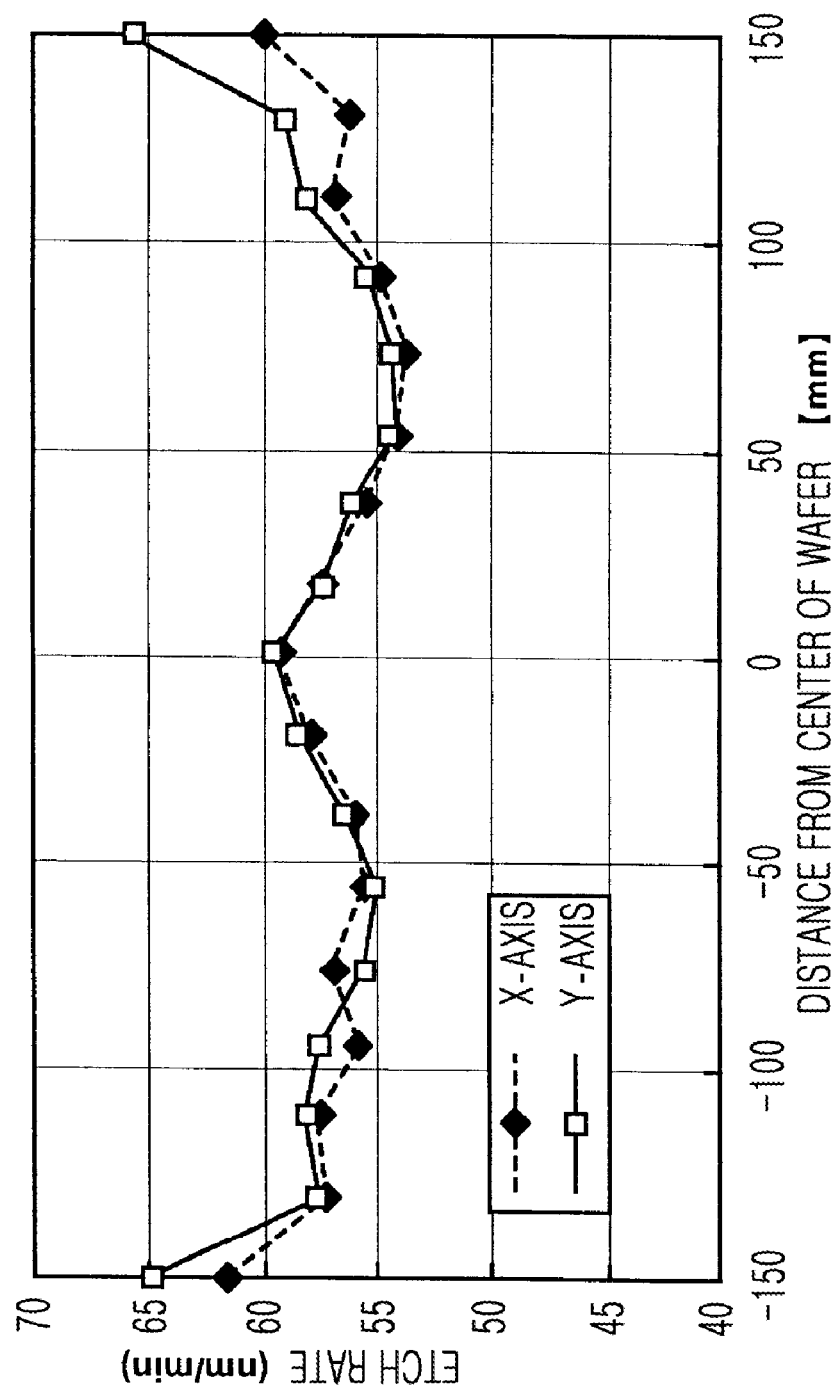
FIG. 5 is a graph showing a result obtained after measuring an etch rate of a photoresist of each of portions of a semiconductor wafer.
Figure 5B:
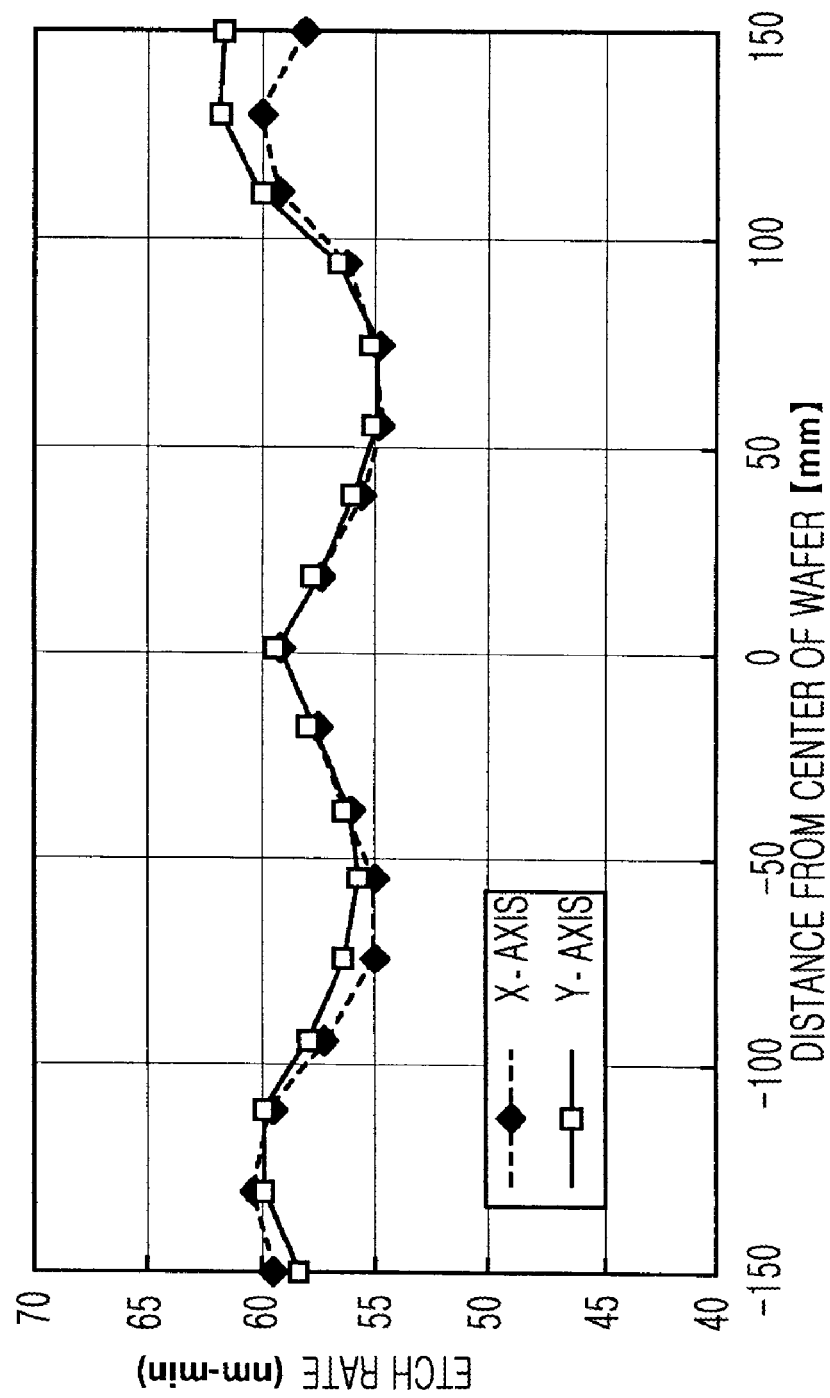

Graphs of FIGS. 5A and 5B show results obtained after measuring an etch rate of a photoresist in each portion of a semiconductor wafer when plasma etching is performed in a conventional apparatus and a plasma etching apparatus of the present embodiment (and ESC of a sprayed coating film formed of $Al_2O_3$ and a silicon focus ring having a thickness of 1.4 mm are used). In the graphs, a vertical axis represents an etch rate and a horizontal axis represents a distance from a center of the wafer. Also, a dotted line indicates an etch rate with respect to an X-axis, and a solid line indicates an etch rate with respect to a Y-axis perpendicular to the X-axis.

As shown in FIG. 5A, in the conventional apparatus, an etch rate of a photoresist sharply increases in a peripheral portion of a semiconductor wafer W. However, as shown in FIG. 5B, in the present embodiment, an etch rate of a photoresist in a peripheral portion of a semiconductor wafer W is kept from increasing. Accordingly, a selectivity between the photoresist and, for example, a silicon oxide film to be etched, in the peripheral portion of the semiconductor wafer W may be kept from decreasing. Also, an average etch rate is 57.4 nm/min in a thickness direction (in-plane uniformity of ±10%) in the conventional apparatus shown in FIG. 5A, whereas an average etch rate is 57.8 nm/min in a thickness direction (in-plane uniformity of ±6.1%) in the present embodiment shown in FIG. 5B, which is higher than the in-plane uniformity of the conventional apparatus. Accordingly, a temperature of the peripheral portion of the semiconductor wafer W is kept from increasing, thereby improving in-plane uniformity of a selectivity of a photoresist.

Also, the present invention is not limited to the embodiment, and various modifications may be made. For example, a plasma etching apparatus is not limited to a parallel plate-type plasma etching apparatus which vertically supplies high frequency power shown in FIG. 1, and may be applied to a plasma etching apparatus which applies high frequency power having one or two frequencies to only a lower electrode. Also, the present invention is not limited to a plasma etching apparatus, and may be applied to any plasma processing apparatus, for example, a film formation apparatus, as long as the plasma processing apparatus uses plasma.

The present invention may provide a plasma processing apparatus which may improve in-plane uniformity of plasma processing by keeping a temperature of a peripheral portion of a substrate to be processed from increasing, thereby making it possible to perform uniform plasma processing.

What is claimed is:

1. A plasma processing apparatus comprising:
a processing chamber an inside of which is airtightly closable;
a process gas supplying mechanism which supplies a process gas into the processing chamber;
an exhaust mechanism which evacuates the inside of the processing chamber;
a plasma generating mechanism which generates plasma from the process gas;
a holding stage which is provided in the processing chamber and is configured such that a substrate to be processed and a focus ring provided to surround the substrate to be processed are held on a same plane;
a temperature control mechanism which adjusts a temperature of the holding stage; and
an electrostatic chuck which is provided on a top surface of the holding stage and comprises an adsorbing electrode extending to a portion under the focus ring,
wherein a boundary portion, of the adsorbing electrode of the electrostatic chuck, between the substrate to be processed and the focus ring is bent downward.

2. The plasma processing apparatus of claim 1, wherein the electrostatic chuck comprises insulating layers and the adsorbing electrode interposed between the insulating layers, and the insulating layers and the adsorbing electrode are formed by spraying.

3. The plasma processing apparatus of claim 1, wherein the plasma generating mechanism generates plasma from the process gas by applying high frequency power between the holding stage and an upper electrode that is provided to face the holding stage.

4. The plasma processing apparatus of claim 1, wherein the insulating layers of the electrostatic chuck are sprayed coating films formed of $Y_2O_3$ or $Al_2O_3$.

* * * * *